(12) United States Patent
Hamashita

(10) Patent No.: US 7,936,293 B2
(45) Date of Patent: May 3, 2011

(54) DELTA-SIGMA MODULATOR

(75) Inventor: Koichi Hamashita, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 43 days.

(21) Appl. No.: 12/483,709

(22) Filed: Jun. 12, 2009

(65) Prior Publication Data

US 2009/0309774 A1     Dec. 17, 2009

(30) Foreign Application Priority Data

Jun. 17, 2008  (JP) ................... 2008-158251

(51) Int. Cl.
*H03M 3/00* (2006.01)

(52) U.S. Cl. ....................................... 341/143

(58) Field of Classification Search ............. 341/143
See application file for complete search history.

(56) References Cited

U.S. PATENT DOCUMENTS

| | | | |
|---|---|---|---|
| 4,851,841 A | 7/1989 | Sooch | |
| 5,311,181 A * | 5/1994 | Ferguson et al. | 341/143 |
| 5,654,711 A * | 8/1997 | Fujimori | 341/143 |
| 6,424,279 B1 * | 7/2002 | Kim et al. | 341/143 |
| 6,822,594 B1 | 11/2004 | Melanson et al. | |
| 2008/0068241 A1 * | 3/2008 | Hong | 341/143 |

OTHER PUBLICATIONS

Moussavi et al., High-Order Single-Stage Single-Bit Oversampling A/D Converter Stabilized with Local Feedback Loops, IEEE Transactions on Circuits and Systems II: Analog and Digital Signal Processing, Jan. 1994, vol. 41 , Issue:1, pp. 19-25.*
Au et al., A 1.95-V, 0.34-mW, 12-b Sigma-Delta Modulator Stabilized by Local Feedback Loops, IEEE Journal of Solid-State Circuits, Mar. 1997 vol. 32 Issue:3, pp. 321-328.*
Fujimori et al., A 5-V Single-Chip Delta-Sigma Audio A/D Converter with 111 dB Dynamic Range, , IEEE Journal of Solid-State Circuits, Issue Date: Mar. 1997 vol. 32 Issue:3 On pp. 329-336.*
Naus et al. "A CMOS Stereo 16-bit D/A Converter for Digital Audio", IEEE Journal of Solid-State Circuits, vol. sc-22, No. 3, Jun. 1987, pp. 390-395.
Matsuya et al. "A 16-bit Oversampling A-to-D Conversion Technology Using Triple -Integration Noise Shaping", IEEE Journal of Solid-State Circuits, vol. sc-22, No. 6, Dec. 1987, pp. 921-929.

(Continued)

*Primary Examiner* — Howard Williams
(74) *Attorney, Agent, or Firm* — Morgan, Lewis & Bockius LLP

(57) ABSTRACT

An object is to provide a stable delta-sigma modulator having good microlevel signal reproducibility and capable of outputting a 1-bit PDM signal with a low oversampling ratio of about 64 times at a high duty ratio of 90% or more. The delta-sigma modulator has a higher-order loop filter; a first 1-bit quantizer for making a decision as to the output of the higher-order loop filter; a first feedback component for feeding the first output signal back to the input stage of the higher-order loop filter; a second 1.5-bit quantizer for making a decision as to the output absolute value of an internal stage to be monitored; a second dynamic feedback component for feeding a second output signal back to the input stage of the higher-order loop filter; and an operational unit for producing a 1-bit PDM signal Y by performing operation on the first output signal and second output signal.

8 Claims, 8 Drawing Sheets

OTHER PUBLICATIONS

Welland et al. "A Stereo 16-Bit Delta-Sigma A/D Converter for Digital Audio", J. Audio Eng. Soc., vol. 37, No. 6, Jun. 1989, pp. 476-486.

Fujimori et al. "A Fifth-Order Delta-Sigma Modulator with 110 dB Audio-Band Dynamic Range", Audio Eng. Soc. 93rd Convention, 3415(L-1), Oct. 1992, pp. 1-24.

Hamashita et al. "A Single-Chip Stereo Audio CODEC", IEEE 1993 Custom Integrated Circuits Conference, May 1993, pp. 28.4.1-28.4.4.

Inose, et al. "A Telemetering System by Code Modulaton . . .", IRE Transactions on Space Electronics and Telemetry, vol. 8, pp. 204-209, Sep. 1962.

* cited by examiner (TRUTH TABLE)

| $S_0$ | Y2+ | Y2- | Y2 |
|---|---|---|---|
| $S_0 > V_{TH}$ | H | L | +m |
| $V_{TH} > S_0 > -V_{TH}$ | L | L | 0 |
| $-V_{TH} > S_0$ | L | H | -m |

FIG.5B

DELTA-SIGMA MODULATOR

This application claims the benefit of Japanese Patent Application No. 2008-158251, filed Jun. 17, 2008, which is hereby incorporated by reference herein in its entirety.

BACKGROUND OF THE INVENTION

1. Field of the Invention

The present invention relates to a delta-sigma modulator, and more particularly to a 1-bit output type delta-sigma modulator for converting an input signal to a 1-bit PDM (Pulse Density Modulation) signal in proportion to the signal level and for outputting it.

2. Description of Related Art

At first, in contrast to delta modulation in a voice communication field, which was unable to handle a DC component, delta-sigma modulation was proposed as an efficient modulation technique capable of handling a DC component, that is, as a technique capable of converting an analog signal to a 1-bit PDM signal during the 1960s. However, it had not yet spread from a point of view of a signal bandwidth and an S/N ratio of the LSI technique at that time (see Non-Patent Document 1, for example).

[Non-Patent Document 1] H. Inose, Y. Yasuda and J. Murakami, "A telemetering system by code modulation—Δ-Σ modulation", IRE Trans. Space Electron. Telemetry, vol. 8, pp. 204-209, September 1962.

Then, by the latter half of the 1980s, digital filters were able to be built into LSIs at practical cost because of miniaturization in LSI manufacturing processes, and had appeared as A/D conversion and D/A conversion techniques in voice communication or digital audio field. However, the common sense in academia and industry at that time considered that although telephone voice applications (4 kHz bandwidth, and S/N ratio=70 dB-80 dB) were possible, it was nearly impossible to implement A/D converters or D/A converters for hi-fi audio applications (22 kHz bandwidth, and S/N ratio=90-96 dB) at low cost. This is because it was difficult for the delta-sigma modulation technique to suppress the quantizing noise in a signal bandwidth to about −100 dB or less, because the delta-sigma modulation technique was the so-called oversampling noise shaping technique that carried out A/D conversion to a digital signal with a small number of bits at a sampling rate sufficiently higher than a target signal bandwidth (SBW: Signal BandWidth), and distributed the quantizing noise Qn, which was generated by the conversion to the small number of bits, outside the target bandwidth while repressing the distribution within the target signal bandwidth (SBW).

To achieve this, it is conceivable to take a step of increasing the oversampling ratio sufficiently, or of increasing the order of a loop filter for improving a noise shaping effect. However, as for a loop filter with third order or higher beyond second order, it was considered impossible to realize the delta-sigma modulation constituting a feedback system because of oscillation of the system. In addition, the LSI manufacturing technique at that time, in which a 3 μm gate length process enabling operation using a ±5 V power supply was the mainstream because analog applications required wide dynamic ranges, did not have sufficient speed, and although a 1 μm gate length process aiming at higher speed existed for digital applications, it was unable to provide sufficient analog accuracy because its withstand voltage was 5 V from a single power supply and the dynamic range was narrow. Accordingly, constructing a loop with a stable second order requires to increase the oversampling ratio extremely, which presents a problem of exceeding the limit of the LSI operating speed at that time. Against such problems, there were roughly three currents as the solutions in the latter half of the 1980s.

As a first current, there was a method that limited the order of the loop to a stable second order, and increased the oversampling ratio by a factor of 256, thereby improving the S/N ratio. A typical example thereof was implemented in D/A converters (see Non-Patent Document 2, for example).

[Non-Patent Document 2] P. J. A. Naus, et al. "A CMOS Stereo 16-bit D/A Converter for Digital Audio", IEEE J. of Solid-State Circuits, Vol. SC-22, PP. 390-394, June 1987.

However, the method was for D/A conversion, and the delta-sigma modulator was to be realized by a digital circuit, which was unsuitable for A/D conversion considering the LSI manufacturing technique at that time. This is because in the A/D conversion, the delta-sigma modulator had to be implemented by an analog circuit such as a switched capacitor circuit, and it was difficult for the process at that time to achieve the 256 times oversampling operation while suppressing analog noise such as thermal noise and kT/C noise. Thus, it had declined as a lower oversampling ratio technique appeared which will be described later.

As a second current, there was the so-called MASH (Multi-Stage Noise Shaping) system that cascaded a plurality of first order delta-sigma modulators to implement higher-order delta-sigma modulation in a stable and equivalent manner, thereby reducing the oversampling ratio by a factor of 64 (see, Non-Patent Document 3, for example).

[Non-Patent Document 3] Y. Matsuya, et al. "A 16-bit Oversampling A-to-D Conversion Technology Using TripleIntegration Noise Shaping", IEEE J. of Solid-State Circuits, Vol. SC-22, No. 6, pp. 921-929, December 1987.

However, it is necessary for the present system to logically combining a plurality of 1-bit delta-sigma modulation outputs. More specifically, it requires a correction operational circuit, the so-called noise cancel operational circuit, for obtaining desired noise shaping characteristics by combining individual outputs of the modulators which are produced as a result of the MASH modulation method carried out with an analog circuit. The noise cancel operational circuit makes its final output a PCM (Pulse Code Modulation) signal expressed by a plurality of bits. The PCM signal output from the noise cancel operational circuit is a signal with a high sampling rate used by the modulator such as 64-Fs signal in the case of 64-times oversampling. It is finally converted to a 16-bit PCM signal with 1 Fs=48 kHz with a digital decimation filter located downstream and is output.

Although the present system can maintain loop stability because it is a feedback system with first order, it has difficulty in achieving sufficient audio analog characteristics, and has been used only in the telephone voice band for a long time. This is because although the coefficients formed by the analog circuit are affected by manufacturing variation, the downstream noise cancel operational circuit performs digital operation that does not match the actual coefficients of the upstream analog circuit, which remains as a mismatch factor and deteriorates the linearity of the A/D conversion. Thus, it increases harmonic distortion or floor noise, and is insufficient for A/D conversion of high quality music signals.

A third current was a trial of achieving a higher S/N ratio with a lower oversampling ratio by solving higher-order instability in a higher-order single loop delta-sigma modulator with third order or higher (see Non-Patent Documents 4, 5 and 6, for example).

[Non-Patent Document 4] D. R. Welland, K. Hamashita, et al. "A Stereo 16-bit Delta-Sigma A/D Converter for Digital Audio", J. Audio Eng. Soc., Vol. 37, No. 6, pp. 476-486, June 1989.

[Non-Patent Document 5] I. Fujimori, K. Hamashita, et al. "A Fifth-Order Delta-Sigma Modulator with 110 dB Audio-Band Dynamic Range" Audio Eng. Soc. 93rd Convention, 3415(L-1), October 1992.

[Non-Patent Document 6] K. Hamashita, E. J. Swanson "A Single-chip Stereo Audio CODEC" IEEE CICC'93, S28.4, May 1993.

The present system is one that obtains a stable solution by contriving a configuration of a higher-order loop filter in the so-called single loop type higher-order delta-sigma modulation system that outputs a 1-bit PDM signal. For example, Non-Patent Document 4 achieves fourth-order 1-bit 64-times oversampling, and performance of a 96-dB S/N ratio in an audio band. In addition, Non-Patent Document 5 achieves a 110-dB S/N ratio by using fifth order, and Non-Patent Document 6 discloses a CODEC including a fourth-order 1-bit D/A converter in the same manner as the fourth-order 1-bit A/D converter. The oversampling ratio is controlled at 64 times, and hence the LSI manufacturing technique at the time can realize sufficiently low cost, low power consumption A/D converters or D/A converters. Thus, they have been developed as mainstream techniques in various digital audio systems from professional equipment for studio recording to home audio equipment and portable recorder/players.

The present system has, as single loop characteristics, only one bit analog modulator output, and only a positive or negative reference potential as the feedback within the analog modulator. Accordingly, the 1-bit PDM signal expresses positive full scale or negative full scale subjected to 64-times oversampling, and a downstream 1/64 decimation digital filter converts the signal to an Fs=48 kHz, 16-bit PCM signal. The present system can obviate the need for a noise cancel operational circuit for carrying out inverse conversion of the coefficients of the analog section, which is required in the foregoing MASH system. Accordingly, it is immune to the manufacturing variation, thereby being able to offer substantially linear A/D conversion characteristics.

However, to operate the higher-order single loop delta-sigma modulators as a stable feedback loop, there are two important factors. The method is described in detail on page 2 of Non-Patent Document 5: a first factor is a selecting method of feedforward coefficients a1-a5 from the individual integrator outputs to the 1-bit quantizer in FIG. 2 of Non-Patent Document 5; and a second factor is a gain scaling method of carrying out the correction of the input gain with a downstream digital filter while setting an input signal range narrower than the full scale range of the delta-sigma modulator (see Patent Document 1).

[Patent Document 1] Navdeep Sooch, "Gain Scaling of Oversampled Analog to Digital Converters", U.S. Pat. No. 4,851,841, filed October 1987.

The embodiments in Patent Document 1 are considered to be a stable system that does not oscillate conventionally because they include a second-order single loop configuration for a voice band. In practice, however, an overload phenomenon can occur in which the output of the integrator constituting the loop filter swings greatly at a time of an excessive input, thereby bringing about deterioration in the S/N ratio and large harmonic distortion and producing oscillate in some cases. More specifically, as disclosed in FIG. 2 of Patent Document 1, when assuming that the positive/negative full scale values, which employ as a reference the feedback value of the delta-sigma modulator, are ±1, a sufficient S/N ratio is obtained when the input range is within ±0.8. However, in the case of a large signal input of ±0.8 or more, the noise within the bandwidth increases and the S/N ratio deteriorates. Accordingly, to limit the input range within 80% of the full scale range of the delta-sigma modulator, the input gain is set at 0.8. This means that when considering contrariwise using the input full scale as the reference, the feedback value of the delta-sigma modulator, that is, the feedback gain=1/0.8=1.25. Thus, in FIG. 3 of Patent Document 1, an embodiment is described under the assumption that when the full scale of the analog input signal is ±3 V, the feedback value of the delta-sigma modulator is 1.25 times of that which is equal to ±3.75 V. Accordingly, as for the output from the 1-bit quantizer in the embodiment, the positive full scale value +1 and the negative full scale value −1 are expressed in 1-bit data, followed by assigning +1 to logic 1 and −1 to logic 0 to be output. Consequently, it is output as the so-called 1-bit PDM (pulse density modulation) signal in which when the input signal level increases toward the positive direction, the ratio of 1 increases, whereas when the input signal level increases toward the negative direction, the ratio of 0 increases. However, as a result of the gain scaling, the duty ratio of the output PDM signal does not become 0%-100%, but becomes 0.8 times, that is, 10%-90%. In other words, when the analog input is the positive full scale, the duty becomes 50%+0.8×50%=90%, whereas when the analog input is negative full scale, the duty becomes 50%−0.8×50%=10%.

Originally, an A/D converter is a device for converting an input analog signal within a predetermined ±full scale range to a digital signal while maintaining an accurate gain of 0 dB. Thus, to correct the 0.8-times input gain, the Patent Document 1 proposes a technique that multiplies, while eliminating high frequency noise from the 1-bit PDM signal through a downstream digital filter, the 16-bit PCM signal by a gain equal to the reciprocal of the input gain=1.25 when performing arithmetic processing on the 16-bit PCM signal, thereby maintaining the gain of the entire A/D converter including the digital filter to 0 dB. The technique is effective when it is expected that the final output of the A/D converter is a 16-bit PCM signal after the digital decimation filter.

On the other hand, the delta-sigma modulators shown in the Non-Patent Documents 4-6 are applied to digital music that demands higher performance than the telephone voice band. Thus, they aim at implementing higher-order delta-sigma modulations such as fourth-order or fifth-order modulations stably without bringing about an overload. Accordingly, they require gain scaling greater than the second-order delta-sigma of Patent Document 1. Although the reference materials do not mention any concrete numerical values, an appropriate value as the input gain is about 0.5 times, for example, which is smaller than 0.8 times of the second order. Since the correction of the input gain is carried out by the downstream digital filter, the 0 dB gain is exactly achieved as the entire A/D converter including the digital filter.

Incidentally, the input gain of 0.5 times can be easily realized using a switched capacitor circuit (SC circuit) shown in Non-Patent Documents 4-6. For example, when setting the full scale of the analog input signal at ±3 V, the input gain of 0.5 is feasible by setting the capacitor value Cf of the SC circuit for the full scale feedback at Cf=2Cs with respect to the capacitor value Cs of the SC circuit for sampling the input signal, and by setting the reference potential for the full scale feedback at ±3 V equal to the input full scale. Thus, the amount of charge transferred in both the SC circuits is $Qs=±3 V·Cs$ for the input full scale and $Qf=±3 V·Cf=±3 V·2Cs$ for the full scale feedback, thereby constituting a delta-sigma modulator with the input gain=0.5 times, which enables feedback of the amount of charge twice the input full scale.

In summary, the foregoing gain scaling methods maintain the loop stability of the delta-sigma modulators by multiplying the input signal by the input gain with a prescribed value less than 0 dB, and multiply the fixed filter gain, which is the reciprocal of the input gain, using the downstream digital filter. In addition, the D/A converters have the digital delta-sigma modulators set a fixed input gain, and have the downstream analog 1-bit D/A conversion or an analog post-filter multiply the correction gain needed. However, although such gain scaling can achieve a stable higher-order delta-sigma type ADC or DAC, it is a defect from the viewpoint of the analog performance versus power consumption. For example, in the ADC, the S/N ratio is greatly deteriorated not only by the quantizing noise, but by thermal noise caused by an operational amplifier or SC circuit. For example, the thermal noise due to the SC circuit can be calculated from the capacitance C of the capacitor using kT/C (where k is the Boltzmann constant and T is operating temperature), and to improve the S/N ratio by 3 dB, twice the capacitor value is necessary and the current for driving it becomes twice. Accordingly, implementing the input gain scaling of −0.5 times=−6 dB in the higher-order delta-sigma corresponds to the deterioration of S/N ratio of 6 dB in terms of the analog noise, and both the capacitor value and driving current must be increased four times to counteract the deterioration.

The greatest application of A/D converters to digital audio equipment is A/D conversion of a voice or music signal input from a microphone, and delivers to a digital medium. However, the output level of the microphone itself that converts air vibration from a sound source to an analog electric signal is very small, and the analog output signal level from the microphone is a few tens of millivolts at most even by using electrical amplifier. In contrast, the input full scale level of an A/D converter having a sufficient dynamic range with an S/N ratio of 90 dB is generally several volts, and an amplifier of about 10 dB-40 dB is necessary between the microphone and the A/D converter. In addition, since the distance between the microphone and sound source is not fixed in common, it is general to use for optimum recording a variable gain amplifier capable of varying the gain in accordance with conditions as the amplifier. The greatest problem here is disturbance noise placed into analog wiring from the microphone to the variable amplifier and A/D converter. Generally, the microphone is placed near a sound source such as a man or musical instruments, and the variable amplifier and A/D converter are placed within digital audio equipment such as a recorder, and the signal is transferred between them via the analog wiring. Accordingly, if the disturbance noise is put into the analog wiring, the downstream variable amplifier amplifies the disturbance noise as well and inputs to the A/D converter, thereby causing large sound quality deterioration. The foregoing configuration is referred to as the so-called analog microphone, and noise control measures of the analog signal line are important.

In contrast with the foregoing, the so-called digital microphone has been spread recently which includes the variable gain amplifier and A/D converter and transfers a digital signal to a device. In this case, the adverse effect of the disturbance noise can be greatly eliminated because of the digitized signal transfer. However, it becomes an expensive system owing to an increase of the number of signal lines because it transmits and receives data, a clock signal and a control signal as a digital interface. In addition, it is necessary to standardize an interface between various microphones and recording equipment, and thus there are many problems. One of the most effective example in this current is to employ the USB standard that has become common in the PC field. It is the so-called USB microphone that has an A/D converter and a USB interface function included on a microphone side, and is able to be connected to a PC or game equipment having a USB interface. However, since the USB interface has a large digital circuit scale and is still expensive, and has large power consumption, it is difficult to spread widely to general applications.

In the foregoing background, the so-called PDM microphone utilizing characteristics of a single loop delta-sigma modulator has been investigated as a new standardization movement. More specifically, it is a method that places components up to a delta-sigma modulator for converting the analog signal to a 1-bit PDM signal on the microphone side, and that transfers the 1-bit PDM signal output as it is to the recording equipment side via a digital signal line as a single digital signal. If it becomes possible, a system can be provided which has analog characteristics insensitive to disturbance noise to the digital signal line, has an interface consisting of a simple logic buffer, and is low cost and has low power consumption. As for the 1-bit PDM signal output from the PDM microphone, the apparatus side can convert it simply to a 1 Fs=48 kHz, 16-bit PCM signal with a conventional decimation digital filter.

However, what is necessary here is the standardization of an oversampling ratio. If the oversampling ratio varies from 64 to 256 times depending on various types of microphones, the operation of the decimation filter cannot be executed correctly. In addition, even if it employs the 1-bit transfer, to aim at a system configuration with power consumption as low as possible, a low transfer rate is preferable, and a lower oversampling ratio should be selected as far as possible. However, as is clear from the foregoing conventional technique, to enable the 1-bit PDM signal output with 64-times oversampling ratio in audio applications (SBW=22 kHz, and S/N=90 dB or more), a higher-order single loop delta-sigma modulator with a fourth-order or so is necessary. Accordingly, the gain scaling of about −6 dB is essential, and the output duty of the 1-bit PDM signal is limited to about 50%. This results in reduction in efficiency of the total system, that is, reduction in the efficiency in terms of a dynamic range, S/N ratio and power consumption. To circumvent the gain scaling, a second-order delta-sigma modulation is used. However, it has a high oversampling ratio of 256 times, and is inefficiency as well.

The present invention is implemented to solve the foregoing problems. It is therefore an object of the present invention to provide a stable delta-sigma modulator with good microlevel signal reproducibility capable of outputting a 1-bit PDM signal of a low oversampling ratio of about 64-times at a high duty ratio of 90% or more.

SUMMARY OF THE INVENTION

To solve the foregoing problems, a delta-sigma modulator in accordance with the present invention comprises: a higher-order loop filter having a plurality of internal stages and receiving an analog input signal; a 1-bit quantizer for making a decision as to whether output of the higher-order loop filter is positive or negative with respect to an analog reference potential, and for outputting a first output signal Y1; a first feedback component for carrying out D/A conversion of the first output signal Y1 to a negative or positive full scale level of the analog input signal, and for feeding it back to an input stage of the higher-order loop filter; a 1.5-bit quantizer for making a decision that an output value of a prescribed internal stage of the plurality of the internal stages, inclusive of the polarity of the output value, exceeds a predetermined reference value, and for outputting a second output signal Y2; a second feedback component for carrying out D/A conversion of the second output signal Y2 to m times a negative or positive full scale level of the analog input signal, and for feeding it back to the input stage of the higher-order loop filter; and an operational unit for generating a 1-bit PDM signal Y by performing operations on the first output signal Y1(+1, −1) and the second output signal Y2(+m, 0, −m).

The delta-sigma modulator in accordance with the present invention can have a configuration wherein the higher-order loop filter is a higher-order integrator constructed by connecting two or more integrators in cascade, and wherein outputs of the plurality of integrators correspond to the plurality of internal stages constituting the higher-order loop filter.

The delta-sigma modulator in accordance with the present invention can have a configuration wherein the higher-order loop filter comprises an n-order integrator constructed by connecting two or more integrators in cascade; and a component for adding outputs of the n integrators in accordance with prescribed ratios a1-an, and for supplying an addition result to the 1-bit quantizer, and wherein the outputs of the n integrators correspond to n internal stages of the higher-order loop filter.

The delta-sigma modulator in accordance with the present invention can have a configuration wherein the higher-order loop filter has one of a low-pass characteristic, bandpass characteristic and high-pass characteristic, each of which is composed of a plurality of operational amplifiers, and wherein outputs of the plurality of operational amplifiers correspond to the plurality of internal stages constituting the higher-order loop filter.

The delta-sigma modulator in accordance with the present invention can have a configuration wherein the 1.5-bit quantizer is a window comparator composed of two comparators; the decision reference value is a positive decision reference value +Vth and a negative decision reference value −Vth with respect to the analog reference potential when the higher-order loop filter has a single end circuit configuration; the decision reference value is a positive decision reference value +Vth and a negative decision reference value −Vth as a full differential signal when the higher-order loop filter has a full differential circuit configuration; and as the second output signal Y2, +m is output when the prescribed internal stage output level is +Vth or more, −m is output when it is −Vth or less, and zero when it is between +Vth and −Vth.

The delta-sigma modulator in accordance with the present invention can have a configuration wherein the prescribed internal stage in the higher-order loop filter is the most effective internal stage for a loop stability or for circumventing overload, and is a single internal stage or a result of adding outputs of the plurality of internal stages at prescribed ratios.

The delta-sigma modulator in accordance with the present invention can have a configuration wherein the first output signal Y1 is a 1-bit PDM signal intended to take +1 or −1, and the second output signal Y2 is a 1.5-bit PDM signal intended to take +m or −m or 0, and wherein the second output signal Y2 is temporarily stored in the operational unit, is added to the first output signal Y1 in accordance with the polarity and gain m of the second output signal Y2 when an opposite polarity signal appears in the first output signal Y1, and is output to the PDM signal Y.

The delta-sigma modulator in accordance with the present invention can have a configuration wherein the feedback gain m from the 1.5-bit quantizer is an integer normally, and unless it is an integer, the feedback gain m undergoes correction by the operational unit before the 1-bit PDM signal Y is output.

As described above, according to the present invention, in the delta-sigma modulator including the higher-order loop filter of a second order or higher, a stable modulator can be provided which eliminates the overload problem or oscillation at the time of excessive input by monitoring the internal condition of the higher-order loop filter and by causing the second feedback function to operate when necessary. It can obviate the need for the conventional gain scaling method, and obtain the 1-bit PDM signal output Y as the final output by combining the two output signals. As for the duty ratio of the 1-bit PDM output signal Y, it is possible to implement the output with the duty ratio close to 0%-100% which is impossible by the gain scaling method, thereby being able to achieve the wider output dynamic range.

In addition, according to the present invention, the stable 1-bit PDM signal output type delta-sigma modulator can be provided not only for the low-pass type using a high-order integrator, but also for the bandpass type or high-pass type delta-sigma modulator with an order equivalent to or higher by monitoring the internal condition necessary and by operating the second feedback function as needed.

Furthermore, the present invention is also applicable not only to a discrete time delta-sigma modulator assuming a switched capacitor circuit, but also to a continuous time delta-sigma modulator easily by implementing the higher-order loop filter with continuous time circuit components.

Besides, according to the present invention, a stable, higher output duty ratio delta-sigma modulator for a variety of applications can be provided because of the great freedom of choice of the method of monitoring the internal condition of the higher-order loop filter, of the method for activating the second feedback function only when necessary, and of the method of selecting the second feedback gain, and at the same time because of the feasibility of the 1-bit PDM signal Y as the final output with a simple circuit.

In addition, according to the present invention, a wide dynamic range, low power consumption delta-sigma modulator can be provided because it can reduce the power wasted by the gain scaling method and reduce the analog noise such as the kT/C noise by activating the second feedback only when necessary.

Furthermore, although it is desirable to make use of the basic concept in accordance with the present invention in an analog delta-sigma modulator serving as an A/D converter, it is also applicable to a digital delta-sigma modulator whose higher-order loop filter is realized by a digital adder and a register. The 1-bit PDM signal output from the digital delta-sigma modulator is also applicable to the so-called 1-bit delta-sigma type D/A converter for performing 1-bit D/A conversion.

According to the present invention, it becomes possible to provide a higher-order delta-sigma modulator that can obviate the need for the gain scaling method essential for the conventional technique, that is stable and can prevent the overload condition using a low oversampling ratio of about 64-times, that has good microlevel signal reproducibility, and that is able to output the 1-bit PDM signal with an output duty ratio of 90% or more. Furthermore, it is possible to provide a product that can achieve higher analog performance inexpensively and easily at power consumption lower than the conventional technique by removing the conventional gain scaling function, and at the same time that can achieve a wide output dynamic range with the output duty ratio of 90% or more as the 1-bit output type A/D converter with a low oversampling ratio, which is particularly necessary for the PDM microphone applications recently.

Further features of the present invention will become apparent from the following description of exemplary embodiments (with reference to the attached drawings).

BRIEF DESCRIPTION OF THE DRAWINGS

FIGS. 5A and 5B are diagram for explaining an example of the operation of a 1.5-bit quantizer in accordance with the present invention in detail;

DESCRIPTION OF THE EMBODIMENTS

The embodiments in accordance with the invention will now be described with reference to the accompanying drawings.

First, the first embodiment in accordance with the present invention will be described.

Figure 1:
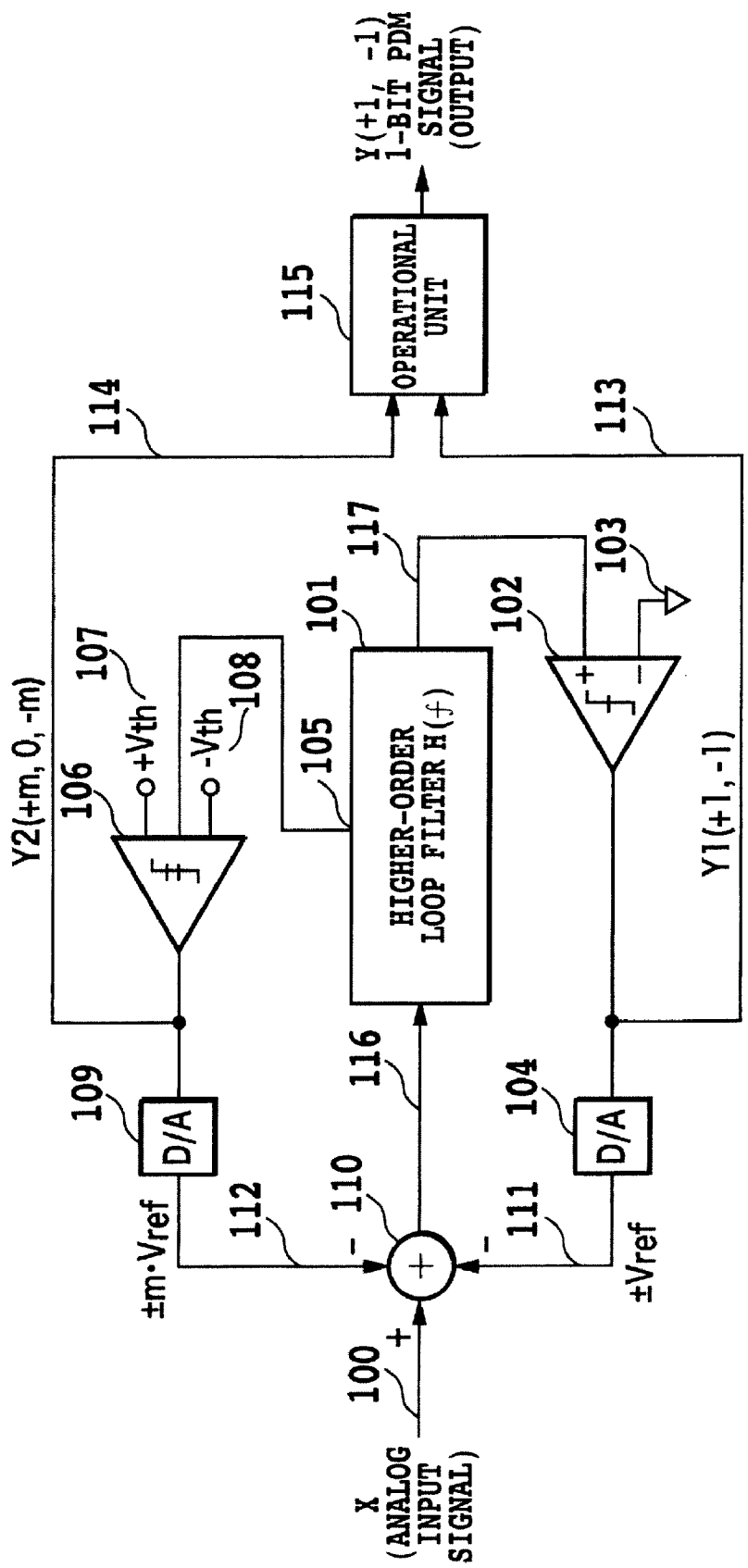
FIG. 1 is a block diagram showing a higher-order analog delta-sigma modulator for converting an input analog signal to a 1-bit PDM signal as a first embodiment in accordance with the present invention.

FIG. 1 is a block diagram showing an analog delta-sigma modulator for converting an input analog signal to a 1-bit PDM signal as the first embodiment in accordance with the present invention. In FIG. 1, the delta-sigma modulator is composed of an input adder 110 for subtracting first and second feedback values from an analog input signal X; a higher-order loop filter 101 of a second order or higher, which is supplied with the output of the input adder 110; a first 1-bit quantizer 102 for making a 1-bit decision as to the output from the higher-order loop filter; a first D/A converter 104 and a feedback component 111 for converting the 1-bit quantizer output Y1 to an input full scale value ±Vref, and feeding it back to the input adder 110; a second 1.5-bit quantizer 106 for comparing the level of an internal stage output 105 of the higher-order loop filter with positive and negative decision reference values ±Vth designated by reference numerals 107 and 108 to make a decision; a second D/A converter 109 and a feedback component 112 for converting the 1.5-bit quantizer output Y2 to m-times the input full scale value ±m·Vref, and feeds it back to the input adder 110; and an operational unit 115 for combining the two quantizer outputs Y1 and Y2 supplied thereto into a 1-bit PDM signal.

Figure 2:
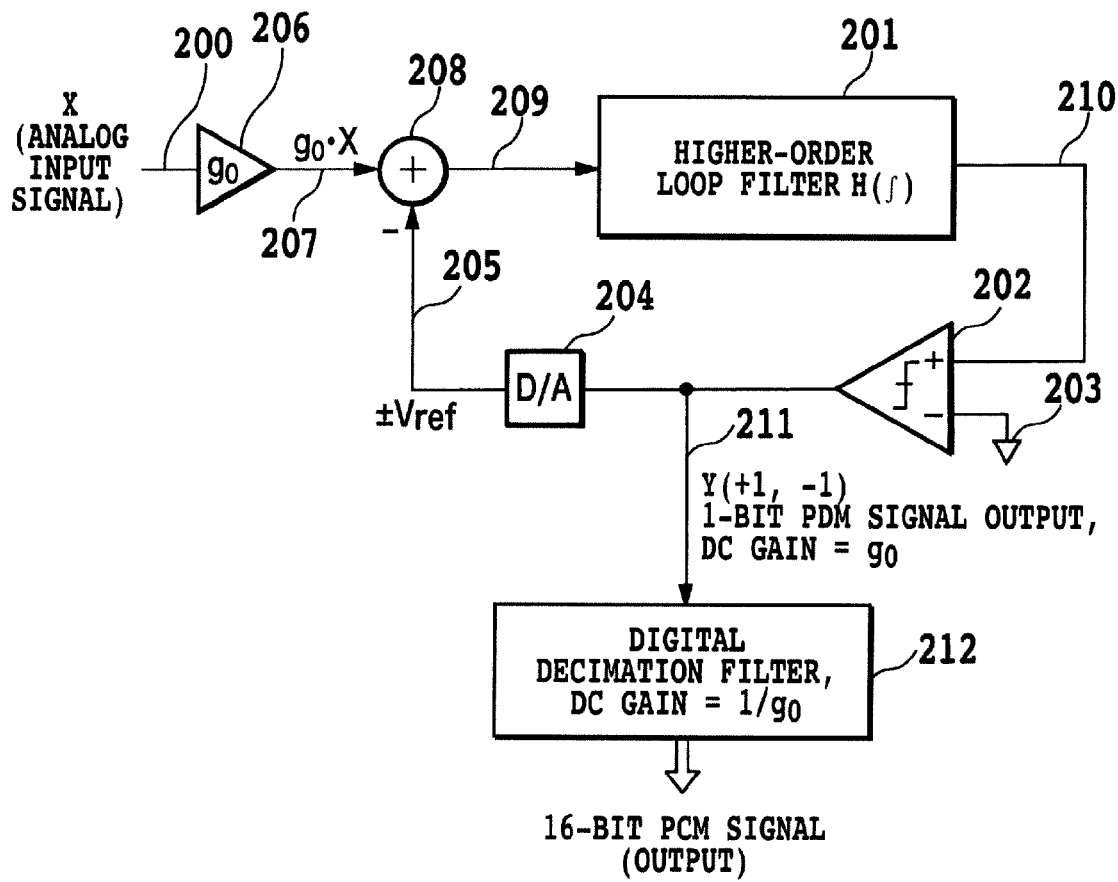
FIG. 2 is a block diagram showing an example of an A/D converter as a conventional technique, which is composed of a 1-bit delta-sigma modulator and a digital decimation filter, and employs a gain scaling technique.

Next, a configuration of a conventional technique is shown in FIG. 2 for comparison.

FIG. 2 is a block diagram showing as a conventional technique an example of an A/D converter composed of a 1-bit delta-sigma modulator using a gain scaling technique and a digital decimation filter. In FIG. 2, the A/D converter is composed of the 1-bit delta-sigma modulator which undergoes the gain scaling in accordance with a DC gain g0, and a digital decimation filter 212 with a DC gain of 1/g0. The 1-bit delta-sigma modulator includes an input gain component 206 for multiplying the analog input signal X by the gain g0 less than one to attenuate it below a prescribed level; an input adder 208 for subtracting the feedback value ±Vref from the output g0·X of the input gain component; a higher-order loop filter 201 supplied with the output of the input adder 208; a 1-bit quantizer 202 for making a 1-bit decision of the output from the higher-order loop filter; and a D/A converter 204 and a feedback component 205 for converting the 1-bit quantizer output Y to the input full scale value ±Vref and for feeding it back to the input adder 208. The digital decimation filter 212 converts the oversampled 1-bit delta-sigma modulator output Y to a PCM (pulse code modulation) signal with the sampling frequency of 1-times (1fs) by eliminating high frequency quantizing noise.

Next, the operation of the delta-sigma converter in the present embodiment will be described.

As shown in FIG. 1, in the present embodiment, the analog input signal X is input to the higher-order loop filter 101 via the input adder 110. Although the input adder and higher-order loop filter are feasible in either a continuous time system or discrete time system, the following description will be made by way of example of a discrete time system using a switched capacitor circuit for the sake of simplification of explanation. In this case, the input adder is composed of a switched capacitor circuit, and is simply feasible by sharing with a first stage input switched capacitor circuit of the higher-order loop filter. At the same time, the input adder 110 performs subtraction of the first feedback value ±Vref based on the previous sampling decision result by the first 1-bit quantizer 102 and of the second feedback value ±m·Vref based on the previous sampling decision result by the second 1.5-bit quantizer 106. The subtraction is also feasible simultaneously with the input function to the first stage of the higher-order loop filter serving as the switched capacitor circuit.

Accordingly, the input to the higher-order loop filter is:

$$X(n)-(Y1(n-1)\cdot Vref)-(Y2(n-1)\cdot Vref)$$

where (n) represents nth sampling data in the discrete system, and (n−1) represents the first previous sampling data in the discrete system, that is, (n−1)th sampling data. In addition, Y1(n−1) takes a value +1 or −1, and Y2(n−1) takes a value +m or 0 or −m. As for the higher-order loop filter, it is composed of a switched capacitor circuit of a second order or higher, and for ordinary audio applications, since its target signal bandwidth is a rather low frequency range of up to about 22 kHz, a loop filter with its gain increased in the range of 0-22 kHz is preferable. Thus, a low-pass filter is used, but an integrator is more preferable.

The greater the DC gain of the integrator in the range of 0-22 kHz, the greater the quantizing noise suppressing effect is as the delta-sigma modulator. Accordingly, it is preferable that the integrator have a higher order of a second order or higher than a first order. The higher-order loop filter generates the new output 117 and the internal stage output 105 from the new input data and past stored data. The loop filter output 117 is supplied to the 1-bit quantizer 102 as in the conventional single loop delta-sigma modulator, and is output as the new data Y1($n$) of the 1-bit PDM signal Y1. In addition, it is converted to the positive or negative full scale value ±Vref by the 1-bit D/A converter 104, and is fed back to the input adder 110 via the first feedback 111 to be subtracted from the next input sampling value X(n+1).

Since the present embodiment does not employ the gain scaling as the conventional technique shown in FIG. 2, when the input X is large close to the positive or negative full scale, the loop filter has a time delay of several sampling periods at the higher order. Accordingly, the first feedback cannot follow the large input sufficiently, and the internal stage 105 of the higher-order loop filter swings greatly. Thus, the normal analog operation becomes impossible, and particularly the higher-order delta-sigma modulator is in danger of falling into oscillation of the total system. The present embodiment prepares the second feedback functioning effectively as measures against overload. It has a function of monitoring the internal stage 105 of the higher-order loop filter, and of subtracting, if the condition of the internal stage 105 swings greatly, the second feedback value ±m·Vref from the input X.

More specifically, when the input X is large, and hence the mere subtraction of the first feedback cannot handle it, the internal stage 105 of the higher-order loop filter 101 also varies greatly. The internal stage is typified, for example, by each integrator output in the case of an n-order integrator. Although n stage outputs are present, the first stage output closest to the input side has a least time delay, and hence is preferable for monitoring the over-input condition. When monitoring the internal stage condition and if its absolute value reaches the prescribed reference value or more, the 1.5-bit quantizer 106 makes a decision of the condition including the polarity, and outputs the decision value Y2. According to the decision result, it feeds the second feedback value ±m·Vref back to the input adder 110 and subtracts it from the next sampling X(n+1).

Accordingly, as the feedback value at the next sampling, the sum total ±(m+1)·Vref of the first and second feedback values is applied, and the feedback gain of twice is obtained dynamically when m=1, and of three times when m=2. Thus, the overload condition of the internal stage is easily and quickly eliminated, and the delta-sigma modulator continues to function as a stable system. In addition, in the normal condition, the input signal is sufficiently lower than the full scale of the A/D converter and is usually –10 dB or less. In this case, the output level of the internal stage 105 for monitoring is also small enough, and the state of Y2=0 continues, and the second feedback ±m·Vref does not get involved in the input adder. Accordingly, the kT/C noise, which is caused by the switched capacitor circuit for carrying out the second feedback, does not contribute to the small signal characteristics as noise. This makes it possible to eliminate the cause of the S/N deterioration of the conventional technique using the input gain scaling, thereby being able to achieve high analog performance while reducing power consumption.

The two quantizer outputs Y1 and Y2 undergo the logic operation of the operational unit 115, and are output as a 1-bit PDM signal Y. As the logic operation method in this case, $Y(n)=Y1(n)+Y2(n)$ is a fundamental form. However, since $Y1(n)=\pm 1$ and $Y2(n)=0$ or $\pm m$ a simple addition will give the following as the values the final output Y(n) can take.

$Y(n)=\pm 1, -1+m, +1-m, +1+m, -1-m$

Thus, it can take values other than ±1 which are the original values of the 1-bit PDM signal.

Accordingly, focusing on events that Y2(n) normally takes zero continuously, and becomes +m or –m instantaneously, and that since the second feedback operates immediately after Y2(n)=±m occurs, expressing the sampling data after α sampling times as (n+α), where α is an integer greater than one, $Y1(n+\alpha)=-1$ appears immediately after $Y2(n)=+m$, and $Y1(n+\alpha)=+1$ appears immediately after $Y2(n)=-m$, the present embodiment delays Y2(n) using a temporary storage component, and adds it to Y1(n+α) that occurs afterward without fail, thereby generating Y(n+α)=±1 reliably.

For example, assume that m=2 is selected, and the a times delay is represented as $z^{-\alpha}$, then the following expression is given.

$Y(n+\alpha)=Y2(n)\cdot z^{-\alpha}+Y1(n+\alpha)$

Thus, $Y(n+\alpha)=+2-1=+1$, when $Y2(n)=+2$, and $Y(n+\alpha)=-2+1=-1$, when $Y2(n)=-2$ In summary, by storing Y2 in the temporary storage component, and by adding after waiting for the Y1 output to become the inverse polarity, the final output Y is produced as the 1-bit PDM signal whose value is limited to +1 or –1.

Although the foregoing is the case of m=2, when m=1 is selected, carrying out the same operation as described above after waiting for the appearance of the same polarity data twice in the time series data {Y2(n)} enables the final output Y to be output as the 1-bit PDM signal whose value is limited to +1 or –1 in the same manner as described above. It is obvious from the foregoing description that although a similar 1-bit PDM signal can be generated even if m is a decimal fraction rather than an integer, the real circuit becomes simpler when an integer is selected as m.

FIG. 2 shows an example of the conventional technique using the gain scaling method for reference purposes in comparison with FIG. 1. As described in Non-Patent Documents 4-6 and Patent Document 1, to operate the higher-order single loop delta-sigma modulator stably and particularly to handle the excessive input, the input signal X undergoes attenuation by the DC gain smaller than one such as g0=0.5 through the input gain component 206, and is supplied to the delta-sigma modulator. Accordingly, when g0=0.5, the duty ratio of the modulator output Y is limited to 25%-75% with respect to the full scale input, and the downstream digital filter performs gain processing of 1/g0=1/0.5=2, and outputs a 16-bit PCM signal. The conventional system is unsuitable for the PDM microphone applications, which output the 1-bit PDM signal the present invention aims at, because the final output duty is far from 100% and it cannot make full use of the effective dynamic range. At the same time, because the feedback value ±Vref from the 1-bit DAC is always large as compared with the input signal g0·X, the conventional system is disadvantageous from the viewpoint of the analog characteristics versus power consumption. More specifically, when g0=0.5, the input signal S itself is made –6 dB so that if the kT/C noise due to the switched capacitor circuit and the analog noise N due to operational amplifiers and the like are the same, the S/N ratio, which is the ratio between them, deteriorates by 6 dB.

Next, a second embodiment in accordance with the present invention will be described.

Figure 3:
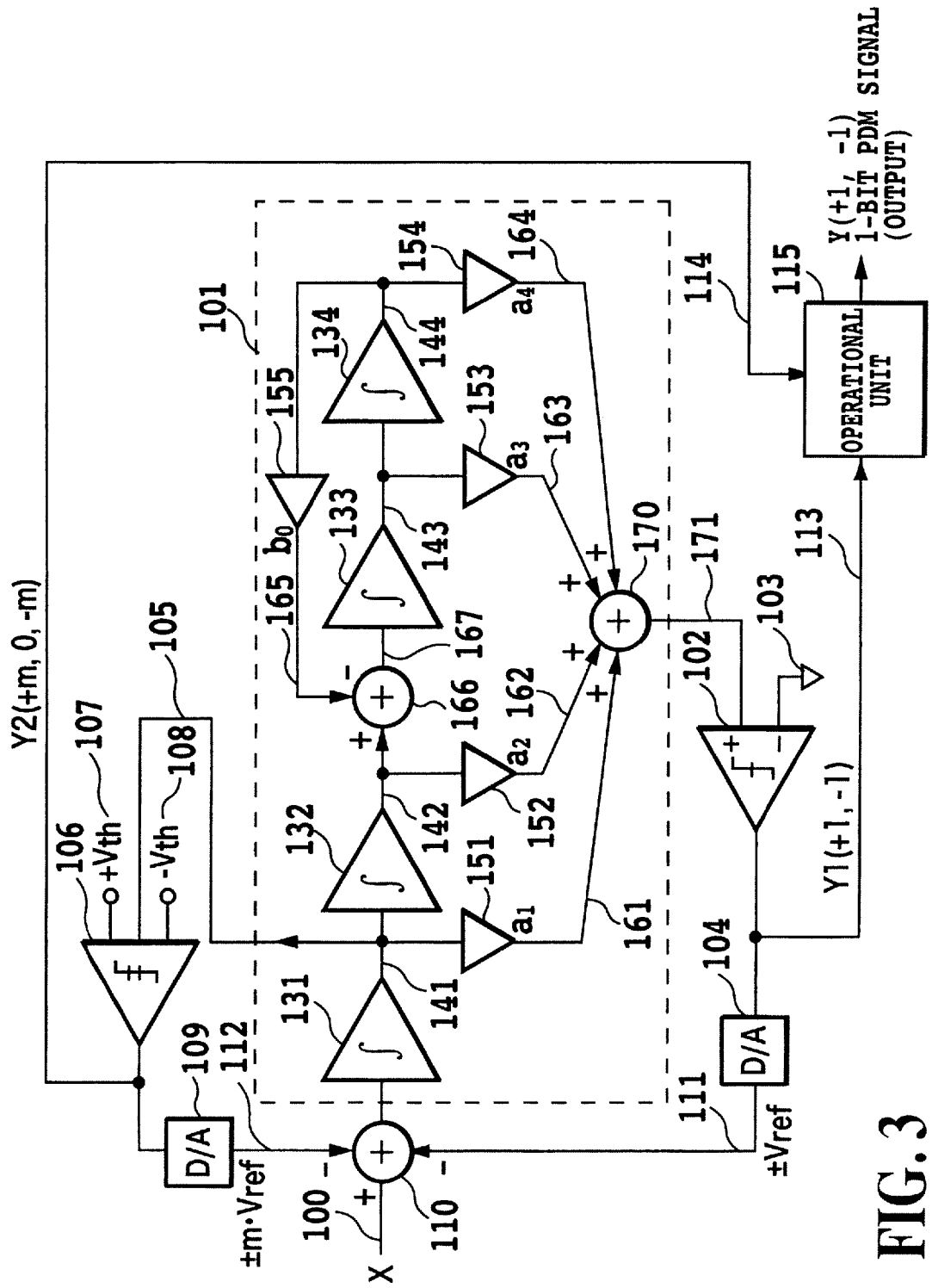
FIG. 3 is a block diagram showing a fourth-order analog delta-sigma modulator having its higher-order loop filter composed of a fourth-order integrator as a second embodiment in accordance with the present invention.

FIG. 3 is a block diagram showing a fourth-order analog delta-sigma modulator that constructs the higher-order loop filter in the first embodiment from a fourth-order integrator as the second embodiment in accordance with the present invention. In the present embodiment, four integrators 131-134 are connected in cascade, and individual integrator outputs 141-144 are supplied to a feedforward adder 170 in accordance with ratios between the four feedforward coefficients a1-a4. The feedforward adder output 171 is supplied to the first 1-bit quantizer 102 as a higher-order loop filter output. As the internal stage of the higher-order loop filter, the present embodiment shows an example of selecting the output 141 of the first integrator 131, and the output is input to the second 1.5-bit quantizer 106 as the internal stage output 105 of the higher-order loop filter. For the sake of simplification of the explanation, the configuration other than the higher-order loop filter is assumed to be the same as the first embodiment.

The present embodiment configures the fourth-order delta-sigma modulator that has the four integrators 131-134 connected in cascade, inputs the individual integrator outputs 141-144 to the feedforward adder 170 in accordance with the ratios between the four feedforward coefficients a1-a4, and inputs the feedforward adder output 171 to the first 1-bit quantizer 102 as the higher-order loop filter output. In addition, the present embodiment has a feedback path provided from the fourth integrator output 144 to the input of the third integrator 133 via a feedback gain 155 that multiplies a coefficient b0 and a path 165. This makes it possible to provide a zero point in the distribution within the signal bandwidth of the quantizing noise as described in Non-Patent Documents 4-6, thereby improving the signal to quantizing noise ratio.

The present embodiment shows an example that selects the output 141 of the first integrator 131 as the internal stage of the higher-order loop filter. The output 141 is input to the second 1.5-bit quantizer 106 as the internal stage output 105 of the higher-order loop filter. For the sake of simplification of the explanation, the configuration other than the higher-order loop filter is assumed to be the same as the first embodiment.

Although the present embodiment can be realized as a continuous time system, the description here is made by way of example configured as a discrete time system using the switched capacitor circuit. Each of the integrators 131-134 is the so-called switched capacitor type integrator, which is composed of a switched capacitor circuit for sampling, an operational amplifier and an integrating capacitor. The input adder 110 can be realized simultaneously with the sampling circuit of the first integrator 131. Accordingly, the sampling of the input X, and the subtraction of the first feedback ±Vref·Y1 and the second feedback ±m·Vref·Y2 can be realized simultaneously as part of the first integrator. More specifically, the D/A conversion to the full scale reference values Vref and m·Vref in the first and second feedback can be easily achieved by using a capacitor with the same size as the sampling capacitor for the input X as the first feedback capacitor, and by using a capacitor with the size m times the first feedback capacitor as the second feedback capacitor. In addition, as for the selection of the positive or negative polarity in accordance with the feedback value Y1 or Y2, when realized by a fully differential circuit, for example, the selection is easily achieved by polarity selection of the two signal paths.

The feedforward coefficients a1-a4 and the feedforward adder 170 are realized as a single switched capacitor circuit that represents the ratios between the coefficients a1-a4 in terms of the ratios of the four sampling capacitors. The switched capacitor circuit simultaneously functions as a sampling capacitor circuit for inputting to the first quantizer 102 which outputs the first decision value Y1. At the same time, it feeds the first decision value Y1 back to the input adder via the first feedback path, which is realized by the foregoing switched capacitor circuit, to be subtracted from the next input sampling X.

Likewise, the internal stage output 105 is realized by sharing the switched capacitor circuit for inputting to the second 1.5-bit quantizer 106. It samples the value of the output 141 of the first integrator 131, compares it with the positive or negative decision reference value. If the output value is +Vth or more, m·Vref is subtracted from the next input sampling X and if it is −Vth or less, −m·Vref is subtracted therefrom.

When expressing the foregoing operation under the assumption that the values of the individual integrator outputs 141-144 at a certain sampling point n are V1(n)-V4(n), the input is X(n), and the two quantizer outputs are Y1(n) and Y2(n), then $$V1(n)=V1(n-1)+X(n)-Y1(n-1)\cdot Vref-Y2(n-1)\cdot Vref$$

$$V2(n)=V2(n-1)+V1(n)$$

$$V3(n)=V3(n-1)+V2(n)-b0\cdot V4(n-1)$$

$$V4(n)=V4(n-1)+V3(n)$$

As for Y1(n), assuming that the feedforward addition result is Sum(n), and by using $$Sum(n)=a1\cdot V1(n)+a2\cdot V2(n)+a3\cdot V3(n)+a4\cdot V4(n)$$

and placing the analog reference potential at zero, then $$Y1(n)=1, \text{ if } Sum(n)>0 \text{ and}$$

$$Y1(n)=-1, \text{ if } Sum(n)<0$$

As for Y2(n), comparing the first integrator output V1(n) with the decision reference value ±Vth, then $$Y2(n)=m, \text{ if } V1(n)>Vth,$$

$$Y2(n)=0, \text{ if } Vth>V1(n)>-Vth$$

$$Y2(n)=-m, \text{ if } -Vth>V1(n)$$

As in the first embodiment shown in FIG. 1, when the absolute value of the input signal X(n) is sufficiently small such as −6 dB or less in the present embodiment, the individual integrator outputs V1(n)-V4(n) do not swing greatly, and can achieve the same stable operation as the conventional fourth-order delta-sigma modulator. More specifically, the value of the internal stage V1(n) monitored is within the range of +Vth--Vth, as a result of which Y2(n)=0 and the second feedback does not operate and the final output Y(n)=Y1(n). In contrast, when the absolute value of the input signal X(n) is large and keeps −6 dB or more, the first integrator output V1(n) begins to swing greatly at first. In response to the value of V1(n), the output of the 1.5-bit quantizer 106 becomes Y2(n)=±m, and ±m·Vref is fed back to the input adder 110 via the second feedback path 112 to be subtracted from the next sampling data X(n+1).

The second feedback, contributing simultaneously with the first feedback, enables the sufficiently large value to be subtracted from the input full scale instantaneously, thereby being able to suppress the next internal stage value V(n+1) to a value small enough. In addition, monitoring the first stage makes is possible to reduce the delay of the second feedback to one sampling delay, which enables implementation of a sufficiently stable system. Incidentally, when it occurs that Y2(n)=±m, the operational unit 115 can calculate the final output Y by adding Y1 and Y2 in the same manner as the foregoing first embodiment.

Incidentally, the decision reference value ±Vth in the second feedback is a value to be determined in accordance with the selection of the individual integrator gains K1-K4 and the coefficients a1-a4 and b0 and the like, and can usually be decided by the simulation inspection at the system level. In addition, although the value ±Vth is normally fixed to a prescribed value, it is also possible to use a variable in accordance with a purpose or input condition.

The present embodiment has been described by way of example employing the discrete time delta-sigma modulator using the switched capacitor circuit to simplify the explanation. However, it is obvious that a continuous time delta-sigma modulator can also be implemented easily by constructing each integrator in FIG. 3 from an input resistor, an integrating capacitor and an operational amplifier, for example; by forming each coefficient by an analog adder that represents it by an input resistance ratio; and by expressing the addition of the first and second feedback values and the input X by input resistors to the first integrator. As could be expected, it is also possible to use the so-called Gm cells instead of the input resistors.

In any case, the fourth-order delta-sigma modulator shown in FIG. 3 can suppress the quantizing noise in the signal bandwidth below −100 dB by the oversampling ratio of 64-times. In addition, it can determine the analog characteristics of the A/D converter such as the final S/N ratio and dynamic range in such a manner that the analog noise of the switched capacitor circuit such as the kT/C noise and operational amplifier noise becomes dominant. In this case, as described in the first embodiment, good characteristics that do not contribute to the second feedback are achieved at lower power consumption when the input signal is small such as −6 dB or less. In contrast, when the input signal is large such as −6 dB or more, the second feedback makes it possible to maintain the stability equivalent to that of the gain scaling method. In addition, as the final output Y, the 1-bit PDM signal is obtained which has a wide dynamic range with a duty ratio of 0%-100%.

Next, a third embodiment in accordance with the present invention will be described.

Figure 4:
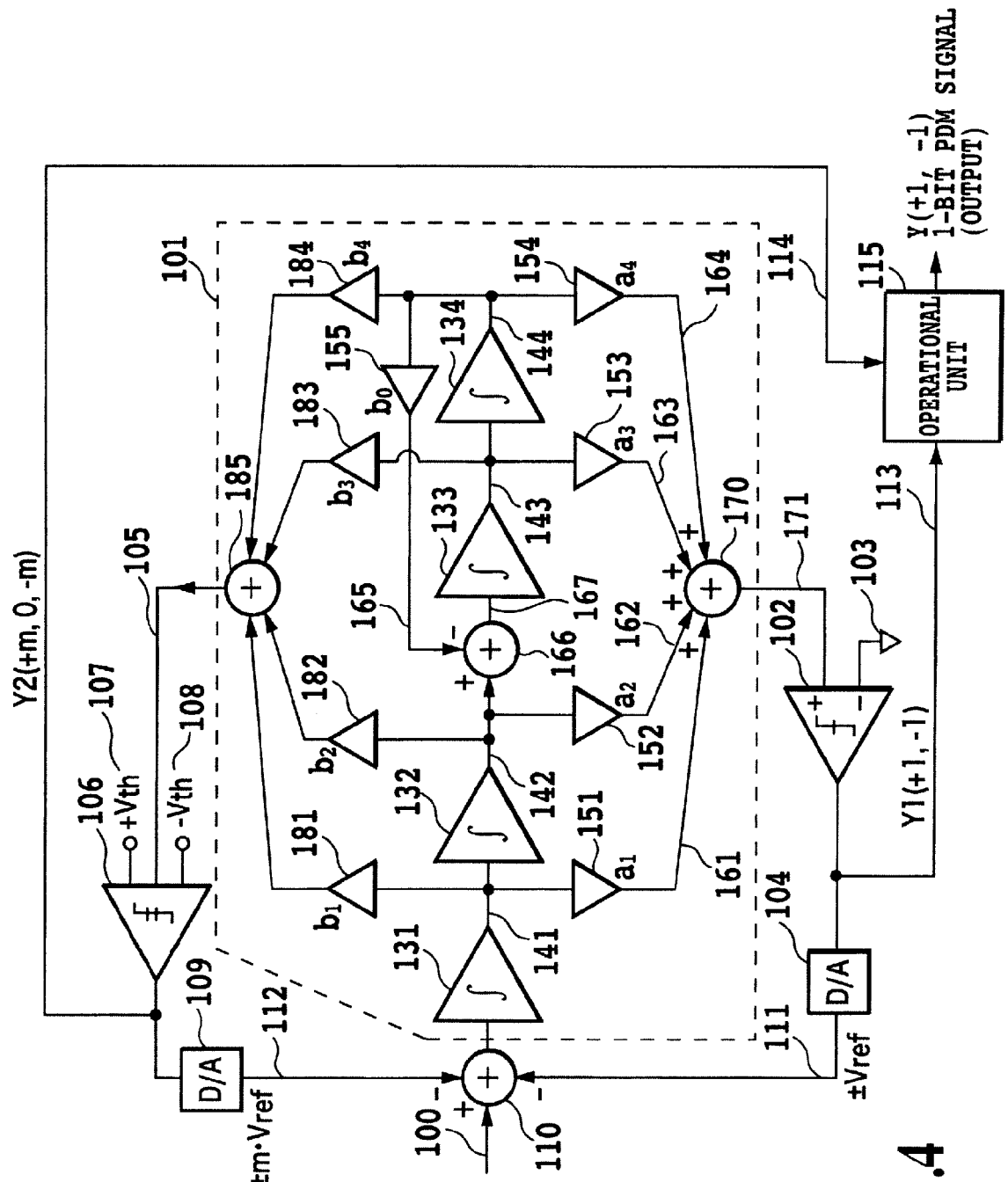
FIG. 4 is a block diagram showing a fourth-order analog delta-sigma modulator using a plurality of integrator outputs as an internal stage to be monitored within a higher-order loop filter as a third embodiment in accordance with the present invention.

FIG. 4 is a block diagram showing a fourth-order analog delta-sigma modulator using a plurality of integrator outputs as the internal stage of the higher-order loop filter as the third embodiment in accordance with the present invention. For the sake of simplification of the explanation, an example is shown which has the higher-order loop filter with a fourth-order configuration as in the second embodiment. To describe a more general application example, the present embodiment employs all the four integrator outputs 141-144, has the individual integrator outputs 141-144 connected to four dynamic feedback paths 181-184, and inputs the addition result of a dynamic feedback adder 185 in accordance with the ratios between coefficients b1-b4 to the second 1.5-bit quantizer 106 as the internal stage output 105. The configuration makes it possible to monitor all the output conditions V1($n$)-V4($n$) in the fourth-order integrator, thereby being able to increase the flexibility in a real circuit design. The basic operation is as follows. Assuming that the addition result of the dynamic feedback adder 185 is Sum2($n$), then comparing $$Sum2(n)=b1 \cdot V1(n)+b2 \cdot V2(n)+b3 \cdot V3(n)+b4 \cdot V4(n)$$

with the decision reference value ±Vth, Y2($n$) is given by $Y2(n)=m$, if $Sum2(n)>V$th $Y2(n)=0$, if $V$th$>Sum2(n)>-V$th and $Y2(n)=-m$, if $-V$th$>Sum2(n)$ The remaining operation is the same as that of the foregoing second embodiment.

The present embodiment is generalization as an example of the fourth-order integrator, and is generally usable by a system of a second-order or higher. In addition, if it is not necessary to monitor all the outputs of the integrators such as monitoring only the first integrator output and second integrator output, it is obvious that the third coefficients b3 and fourth coefficients b4 should be placed at zero.

The foregoing description is made about an example that employs a cascade connection configuration of the integrators as a higher-order loop filter, that is, about a low-pass type delta-sigma modulator. However, as the higher-order loop filter, a similar configuration is also possible using the so-called bandpass type delta-sigma modulator or high-pass type delta-sigma modulator having bandpass characteristics or high-pass characteristics.

Next, an embodiment of the 1.5-bit quantizer 106 described in the first to third embodiments will be described briefly with reference to FIGS. 5A and 5B.

Figure 5A:
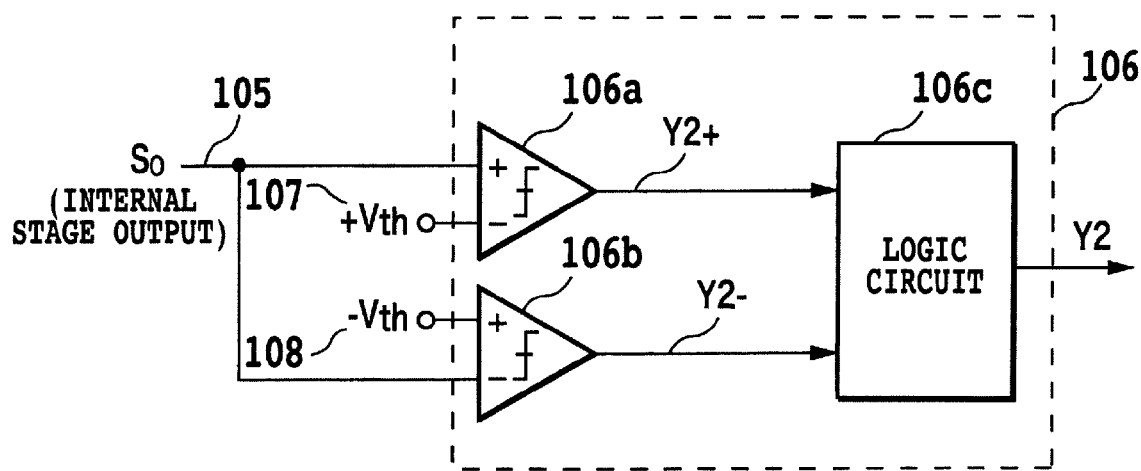

FIGS. 5A and 5B are diagram for explaining an example of the operation of the 1.5-bit quantizer in detail. For the sake of simplification of the explanation, FIGS. 5A and 5B shows a single end type. The 1.5-bit quantizer 106 is normally composed of a fully differential circuit when the higher-order loop filter 101 is a fully differential circuit, but is composed of a single end circuit when the higher-order loop filter 101 is a single end circuit. Here, to simplify the explanation, the description will be made by the single end circuit configuration. As the 1.5-bit quantizer 106, the so-called window comparator basically composed of two quantizers 106$a$ and 106$b$ is used, for example, and a logic circuit 106$c$ is added as needed. The quantizer 106$a$ compares the internal stage output So with the positive decision reference value +Vth to make a decision and outputs Y2+, and the quantizer 106$b$ compares the internal stage output So with the negative decision reference value −Vth to make a decision and outputs Y2−. According to the two outputs Y2+ and Y2−, the logic circuit 106$c$ outputs Y2 in accordance with a truth table. The logic outputs of the two quantizers will be given as follows, when expressing High=H and Low=L.

$Y2+=H$, $Y2-=L$, and $Y2=+m$, if $So>+V$th $Y2+=L$, $Y2-=L$, and $Y2=0$, if $+V$th$>So>-V$th $Y2+=L$, $Y2-=H$, and $Y2=-m$, if $-V$th$>So$ Accordingly, the value Y2 takes one of the three values +m, 0, and −m, and hence the circuit functions as the 1.5-bit quantizer.

Incidentally, as for m in the present embodiment, which represents the gain value in the second feedback, although it is assumed to be an integer normally, it can be other than an integer as described in the previous embodiment. In addition, the logic circuit 106$c$ is not essential, and can be removed if the foregoing Y2+ and Y2− are directly used by the second feedback path 112 and operational unit 115 in such a manner that the function equivalent to the Y2 output in the truth table is realized.

Next, the operation of the operational unit 115 explained in the first to third embodiments will be described in more detail.

Figure 6:
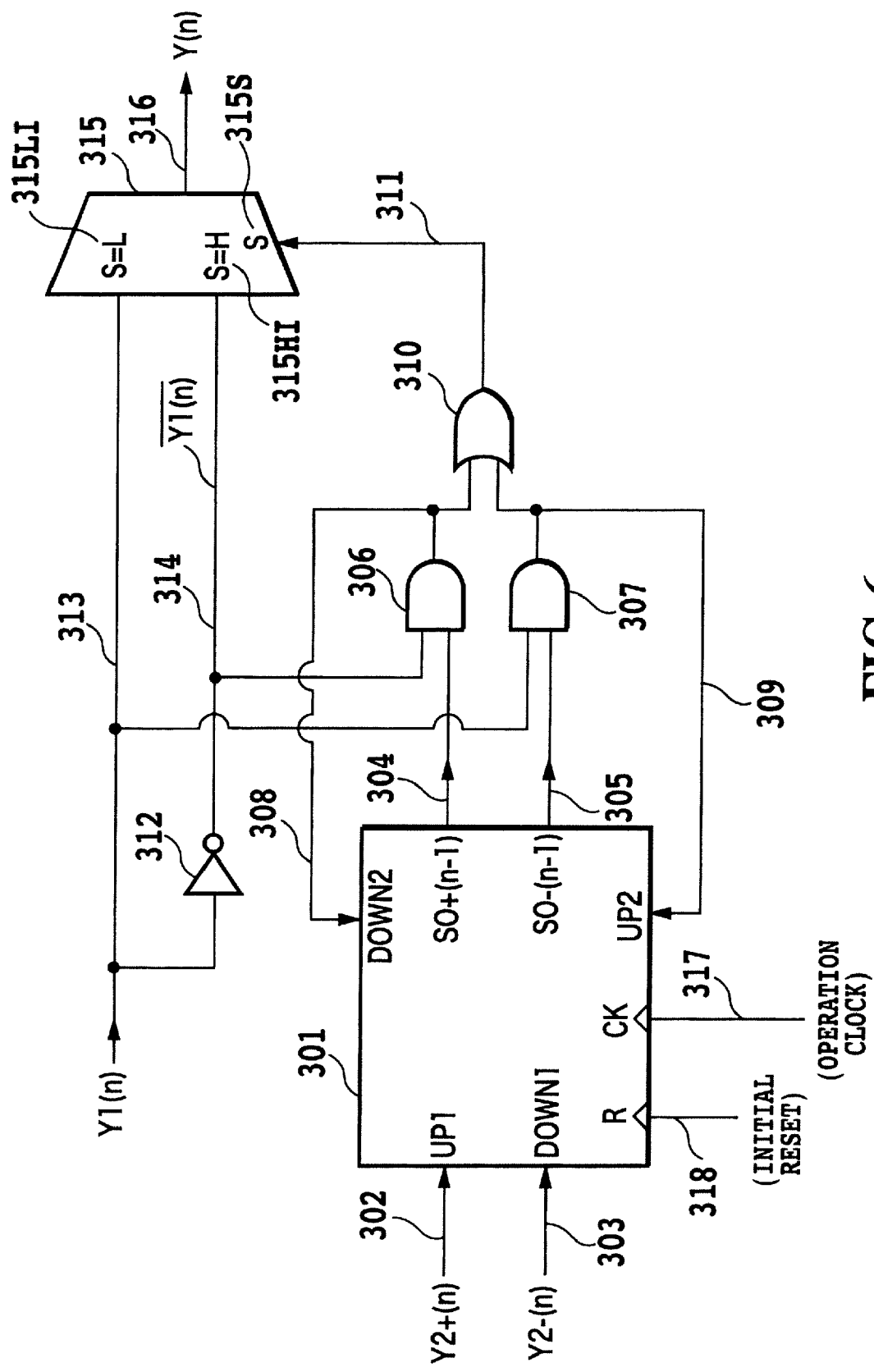
FIG. 6 is a diagram showing an example of an operational unit for combining first and second quantizer outputs into a final 1-bit PDM signal in accordance with the present invention.
Figure 7:
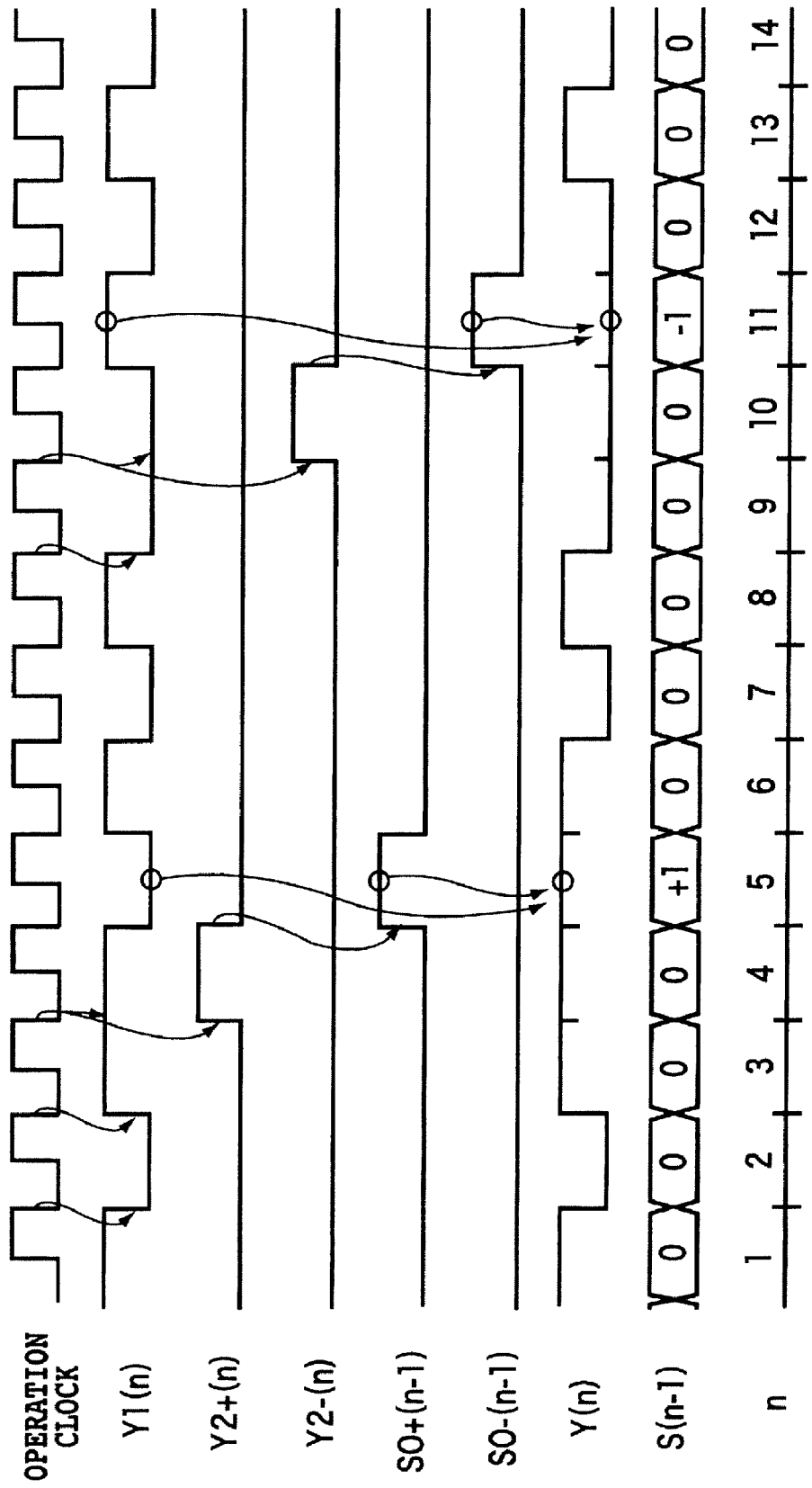
FIG. 7 is a timing chart for explaining the operation of the operational unit shown in FIG. 6.

FIG. 6 is a block diagram showing an embodiment for explaining the operation of the operational unit 115 by way of example which employs an up/down counter as a component for temporarily storing the foregoing Y2($n$), and uses Y2+ and Y2− directly as Y2; and FIG. 7 is a timing chart for explaining the basic operation of the operational unit 115 shown in FIG. 6.

The present embodiment shows a case where the second feedback gain m=2. Besides, as the 1.5-bit quantizer output Y2(n), the positive side decision result Y2+(n) and negative side decision result Y2−(n) before combining them by the logic circuit 106c shown in FIG. 5A are used. The up/down counter 301 is initially reset via a reset terminal 318, and operates at falling edges of an operation clock signal 317. It has two up-signal input terminals 302 and 309 and two down-signal input terminals 303 and 308. Its internal counter is bipolar, which can handle both positive and negative values, and cope with values from the positive maximum value SP_max to the negative maximum value SM_max.

The positive decision result output Y2+(n) from the 1.5-bit quantizer 106 is connected to UP1, the first up-signal input terminal 302, and the negative decision result output Y2−(n) is connected to DOWN1, the first down-signal input terminal 303. The two decision results are brought into the internal counter at the falling edges of the operation clock signal so as to up the counter by +1 or down by −1. More specifically, when Y2+(n)=H, the internal counter value is made +1, and when Y2−(n)=H, the internal counter value is made −1, and when Y2+(n)=L and Y2−(n)=L, the internal counter value is maintained. Since the internal counter value undergoes up/down operation by the falling edges of the operation clock signal, the internal counter can accumulate Y2 results up to the last sampling and store as its value. Accordingly, in the sense that the internal counter value represents the result up to the first previous sampling, by using a symbol (n−1), the internal counter value is represented by S(n−1). As two output terminals for producing the output signal only when the counter value is positive or negative, a positive side output SO+(n−1) designated by the reference numeral 304 and a negative side output SO−(n−1) designated by 305 become as follows.

$$SO+(n-1)=H, SO-(n-1)=L, \text{ if } S(n-1)>0$$

$$SO+(n-1)=L, SO-(n-1)=H, \text{ if } S(n-1)<0$$

$$SO+(n-1)=L, SO-(n-1)=L, \text{ if } S(n-1)=0$$

When S(n−1)>0, the positive side output SO+(n−1) is subjected to an AND decision between it and an inverted signal 314 of the first quantizer output Y1(n) by an AND circuit 306, and its AND result 308 is connected to a second down-signal input terminal DOWN2 of the up/down counter. Accordingly, when the internal counter value S(n−1) becomes positive, SO+(n−1) becomes H, and after waiting until Y1(n)=L appears, the AND circuit output 308 becomes H, and then the falling edge of the next operation clock signal makes the internal counter value −1. At the same time, the H state of the AND circuit output 308 is transferred to the selection instructing terminal 315S of a selector 315 via an OR circuit 310 so that an inverted signal 314 of Y1(n) is output to Y(n). Incidentally, the selector 315 selects an H-selecting time input terminal 315HI to enable output when the selection instructing terminal 315S is H, and selects an L-selecting time input terminal 315LI to enable output when the selection instructing terminal 315S is L.

The foregoing operation is shown simply at locations denoted by sampling numbers n=4-6 in the timing chart of FIG. 7. At sampling number n=4, Y2+(n) becomes H. As a result, the internal counter value S(n−1) changes from 0 to +1 at timing n=5. At the same time, it changes the positive side output SO+(n−1) to H, and waits for Y1(n) to become L. Here, since Y1(n) becomes L immediately at the timing of n=5, the AND logic result 308 between SO+(n−1) and the inverted signal 314 of Y1(n) becomes H. Thus, the selector selection instructing terminal 315S becomes H so that the selector 315 selects the H-selecting time input terminal 315HI to select the inverted signal 314 of Y1(n) In other words, the level H, the result of inverting Y1(n) is output as Y(n). The present example, which sets the second feedback gain at m=2, outputs the following addition result as the final output Y(n) as described in detail in the foregoing first embodiment.

$$Y(n=5)=Y1(n=5)+Y2(n=4)=-1+2=+1$$

In addition, at the timing of n=6, the internal counter value S(n−1) is returned from +1 to 0 because the H output of the AND logic result 308 is connected to the DOWN2 terminal.

In contrast, when S(n−1)<0, the negative side output SO−(n−1) is subjected to an AND decision between it and the noninverted signal 313 of the first quantizer output Y1(n) by an AND circuit 307, and its AND result 309 is connected to a second up-signal input terminal UP2 of the up/down counter. Accordingly, when the internal counter value S(n−1) becomes negative, SO−(n−1) becomes H, and after waiting until Y1(n)=H appears, the AND circuit output 309 becomes H, and then the falling edge of the next operation clock signal makes the internal counter value +1. At the same time, the H state of the AND output 309 is transferred to the selection instructing terminal 315S of the selector 315 via the OR logic 310 so that the inverted signal 314 of Y1(n) is output to Y(n).

The foregoing operation is shown simply at locations denoted by sampling numbers n=10–12 in the timing chart of FIG. 7. At sampling number n=10, Y2−(n) becomes H. As a result, the internal counter value S (n−1) changes from 0 to −1 at timing n=11. At the same time, it changes the negative side output SO−(n−1) to H, and waits for Y1(n) to become H. Here, since Y1(n) becomes H immediately at the timing of n=11, the AND logic result 309 between SO−(n−1) and the noninverted signal 313 of Y1(n) becomes H. Thus, the selector 315 selects the H-selecting time input terminal 315HI to select the inverted signal 314 of Y1(n). In other words, the level L, the result of inverting Y1(n), is output as Y(n). The present example, which sets the second feedback gain at m=2, outputs the following addition result as the final output Y(n) as described in detail in the foregoing first embodiment.

$$Y(n=11)=Y1(n=11)+Y2(n=10)=+1-2=-1$$

In addition, at the timing of n=12, the internal counter value S(n−1) is returned from −1 to 0 because the H output of the AND logic result 309 is connected to the UP2 terminal.

Incidentally, as shown in FIG. 7, when neither Y2+(n)=H or Y2−(n)=H occurs, and the state of the internal counter value S(n−1)=0 continues, the selector selection instructing terminal 315S is always maintained at L. Thus, the selector 315 selects the L-selecting time input terminal 315LI, and the final output Y(n) continues to produce the same value as the first quantizer output Y1(n).

In addition, although FIG. 7 shows only examples in which the internal counter value S(n−1) is +1 or −1, the internal counter value S(n−1) can be +2 or more or −2 or less depending on the input conditions. In this case, the operation is the same as described above.

Furthermore, as the upper limit values of the internal counter value, the present example sets the positive maximum value SP_max and the negative maximum value SM_max so that the internal counter value does not exceed the two limit values. This is because the basic operation of the up/down counter is the same as an accumulator, and hence aiming at circumventing the phenomenon that the counter value changes to the opposite polarity when an overflow occurs in the case of lacking the limits at both the limit values. The limits do not have any adverse effect on the characteristics of the delta-sigma modulator if necessary and sufficient values are set as both the maximum values.

Although the present embodiment shows a concrete example for m=2, in the case of the foregoing m=1, the same circuit as in the case of m=2 becomes feasible by setting, for example, the decision reference for the internal counter value at +2 or more and at −2 or less to produce two outputs SO+ and SO−, and by setting at +2 or −2 the up/down value of the counter in response to the second up/down signals UP2 and DOWN2 based on the outputs. Likewise, when m is a decimal fraction rather than an integer, various components can be devised. For the sake of simplicity, when m=⅔=0.666 . . . , it is enough for the foregoing operation to be executed while outputting Y2 three times. Accordingly, the same circuit as in the case of m=2 becomes feasible by setting the decision reference for the internal counter value at +3 or more and at −3 or less to produce two outputs SO+ and SO−, and by setting at +3 or −3 the up/down value of the counter value in response to the second up/down signals UP2 and DOWN2 based on the outputs.

As described above as to the plurality of embodiments, according to the present invention, in the delta-sigma modulator including the higher-order loop filter of a second order or higher, a stable modulator can be provided which eliminates the overload problem or oscillation at the time of excessive input by monitoring the internal condition of the higher-order loop filter and by causing the second feedback function to operate when necessary. It can obviate the need for the conventional gain scaling method, and obtain the 1-bit PDM signal output Y as the final output by combining the two output signals. As for the duty ratio of the 1-bit PDM output signal Y, it is possible to implement the output with the duty ratio close to 0%-100% which is impossible by the gain scaling method, thereby being able to achieve the wider output dynamic range.

In addition, according to the present invention, the stable 1-bit PDM signal output type delta-sigma modulator can be provided not only for the low-pass type using a high-order integrator, but also for the bandpass type or high-pass type delta-sigma modulator with an order equivalent to or higher by monitoring the internal condition necessary and by operating the second feedback function as needed.

Furthermore, the present invention is also applicable not only to a discrete time delta-sigma modulator assuming a switched capacitor circuit, but also to a continuous time delta-sigma modulator easily by implementing the higher-order loop filter with continuous time circuit components.

Besides, according to the present invention, a stable, higher output duty ratio delta-sigma modulator for a variety of applications can be provided because of the great freedom of choice of the method of monitoring the internal condition of the higher-order loop filter, of the method for activating the second feedback function only when necessary, and of the method of selecting the second feedback gain, and at the same time because of the feasibility of the 1-bit PDM signal Y as the final output with a simple circuit.

In addition, according to the present invention, a wide dynamic range, low power consumption delta-sigma modulator can be provided because it can reduce the power wasted by the gain scaling method and reduce the analog noise such as the kT/C noise by activating the second feedback only when necessary.

Furthermore, although it is desirable to make use of the basic concept in accordance with the present invention in an analog delta-sigma modulator serving as an A/D converter, it is also applicable to a digital delta-sigma modulator whose higher-order loop filter is realized by a digital adder and a register. It is obvious that the 1-bit PDM signal output from the digital delta-sigma modulator is also applicable to the so-called 1-bit delta-sigma type D/A converter for performing 1-bit D/A conversion.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A delta-sigma modulator comprising:
a higher-order loop filter having a plurality of internal stages and receiving an analog input signal;
a 1-bit quantizer for making a decision as to whether output of the higher-order loop filter is positive or negative with respect to an analog reference potential, and for outputting a first output signal Y1;
a first feedback component for carrying out D/A conversion of the first output signal Y1 to a negative or positive full scale level of the analog input signal, and for feeding it back to an input stage of the higher-order loop filter;
a 1.5-bit quantizer for making a decision that an output value of a prescribed internal stage of the plurality of the internal stages, inclusive of the polarity of the output value, exceeds a predetermined reference value, and for outputting a second output signal Y2;
a second feedback component for carrying out D/A conversion of the second output signal Y2 to m times a negative or positive full scale level of the analog input signal, and for feeding it back to the input stage of the higher-order loop filter; and
an operational unit for generating a 1-bit PDM signal Y by performing operations on the first output signal Y1(+1, −1) and the second output signal Y2(+m, 0, −m).

2. The delta-sigma modulator as claimed in claim 1, wherein
the higher-order loop filter is a higher-order integrator constructed by connecting two or more integrators in cascade, and wherein outputs of the plurality of integrators correspond to the plurality of internal stages constituting the higher-order loop filter.

3. The delta-sigma modulator as claimed in claim 1, wherein
the higher-order loop filter comprises an n-order integrator constructed by connecting two or more integrators in cascade; and a component for adding outputs of the n integrators in accordance with prescribed ratios al - an, and for supplying an addition result to the 1-bit quantizer, and wherein the outputs of the n integrators correspond to n internal stages of the higher-order loop filter.

4. The delta-sigma modulator as claimed in claim 1, wherein
the higher-order loop filter has one of a low-pass characteristic, bandpass characteristic and high-pass characteristic, each of which is composed of a plurality of operational amplifiers, and wherein outputs of the plurality of operational amplifiers correspond to the plurality of internal stages constituting the higher-order loop filter.

5. The delta-sigma modulator as claimed in claim 1, wherein
the 1.5-bit quantizer is a window comparator composed of two comparators;
the decision reference value is a positive decision reference value +Vth and a negative decision reference value −Vth with respect to the analog reference potential when the higher-order loop filter has a single end circuit configuration;

the decision reference value is a positive decision reference value +Vth and a negative decision reference value −Vth as a fully differential signal when the higher-order loop filter has a fully differential circuit configuration; and as the second output signal Y2, +m is output when the prescribed internal stage output level is +Vth or more, −m is output when it is −Vth or less, and zero when it is between +Vth and −Vth.

6. The delta-sigma modulator as claimed in claim 1, wherein the prescribed internal stage in the higher-order loop filter is the most effective internal stage for a loop stability or for circumventing overload, and is a single internal stage or a result of adding outputs of the plurality of internal stages at prescribed ratios.

7. The delta-sigma modulator as claimed in claim 1, wherein the first output signal Y1 is a 1-bit PDM signal intended to take +1 or −1, and the second output signal Y2 is a 1.5-bit PDM signal intended to take +m or −m or 0, and wherein the second output signal Y2 is temporarily stored in the operational unit, is added to the first output signal Y1 in accordance with the polarity and gain m of the second output signal Y2 when an opposite polarity signal appears in the first output signal Y1, and is output to the PDM signal Y.

8. The delta-sigma modulator as claimed in claim 7, wherein the feedback gain m from the 1.5-bit quantizer is an integer normally, and unless it is an integer, the feedback gain m undergoes correction by the operational unit before the 1-bit PDM signal Y is output.

\* \* \* \* \*